(12) United States Patent
Becker et al.

(10) Patent No.: US 7,987,587 B2
(45) Date of Patent: Aug. 2, 2011

(54) METHOD OF FORMING SOLID VIAS IN A PRINTED CIRCUIT BOARD

(75) Inventors: Wiren Dale Becker, Hyde Park, NY (US); Michael Ford McAllister, New Milford, CT (US); Alan Daniel Stigliani, Hopewell Junction, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 601 days.

(21) Appl. No.: 12/043,994

(22) Filed: Mar. 7, 2008

(65) Prior Publication Data

US 2009/0223710 A1    Sep. 10, 2009

(51) Int. Cl.
*H05K 3/02* (2006.01)
*H05K 3/10* (2006.01)

(52) U.S. Cl. ............... 29/846; 29/848; 29/851; 29/878

(58) Field of Classification Search ............ 29/846, 29/832, 837, 842, 848, 851, 852, 878; 174/256, 174/261, 263–265; 257/728, E21.508, E21.705, 257/E23.062
See application file for complete search history.

(56) References Cited

U.S. PATENT DOCUMENTS

| | | | |
|---|---|---|---|
| 5,377,902 A | 1/1995 | Hayes | |
| 6,461,136 B1 | 10/2002 | Gruber et al. | |
| 6,708,873 B2 | 3/2004 | Gruber et al. | |
| 6,783,797 B2 | 8/2004 | Bourrieres et al. | |
| 6,913,187 B2 * | 7/2005 | Olofsson | 228/136 |
| 6,982,191 B2 | 1/2006 | Larson | |
| 7,240,425 B2 * | 7/2007 | Khilchenko et al. | 29/837 |
| 2001/0027842 A1 | 10/2001 | Curcio et al. | |

* cited by examiner

*Primary Examiner* — Thiem Phan
(74) *Attorney, Agent, or Firm* — Dennis Jung

(57) ABSTRACT

A method is described by which an electrical path is created between layers on a printed circuit board (PCB) without the use of plated through holes (PTH). Through the use of a liquid solder or conductive epoxy injection fixture, a conductive path is created in pre-drilled holes forming an electrical connection between internal PCB metal layers and surface mounted components without the creation of parasitic stubs on the signal nets.

15 Claims, 7 Drawing Sheets

METHOD OF FORMING SOLID VIAS IN A PRINTED CIRCUIT BOARD

BACKGROUND OF THE INVENTION

1. Field of the Invention

This invention relates to the method of fabrication of printed circuit board (PCB) via structures that eliminate the need for presently used plated through holes (PTH) connection techniques on printed circuit boards.

2. Description of Background

In the present construction of printed circuit boards (PCB), when there is a need to translate from one signal plane to another, to connect similar power layers together, or to interconnect devices on the top or bottom surface of the PCB, a plated through hole (PTH) is created in the PCB. A PCB may also be referred to in the art as a card or board but for purposes of the present invention shall be considered to be the same. This PTH then performs the required interconnect function such as interconnecting reference planes to active circuits, or to interconnect signals between devices. With the speed of computer systems as well as the speeds for supporting circuitry now approaching transfer rates in excess of 10 gigabits/second and beyond, the effects of electrical stubs on the signal nets when a PTH is encountered can impact overall system performance severely. In most cases, as the density of the internal wiring of the PCB is increased, a designer may need to use multiple wiring layers to interconnect the signal traces due to space restrictions of available wiring planes. Thus the designer, when changing wiring planes, must use a translation via or a multiple number of translation vias on the PCB. These vias add an electrical parasitic stub on the wired net, which then impacts the overall electrical performance of the signal path. There have been several suggestions in the past for the elimination of via stubs. One method presently practiced to eliminate via stubs is to drill the via location to remove all unneeded metal from the via core. This requires significant rework of the PCB for critical applications which could prove to be costly when a significant number of locations are to be modified.

In the manufacture of a PCB, a normal PTH is constructed in a manner similar to the following process description. Referring to FIG. 1A, base core (100) materials such as double sided copper clad laminates are etched with the desired patterns on both copper surfaces. This is accomplished through photo resist and etch processes which are repeated for all other base cores (101-104) until all the required number of layers are formed. Then, the multiple cores (100 -104) are laminated together with pre-preg epoxies, forming a structure (10) composed of signal layers (13,14) between reference planes (12,15). Final connection to active and passive components is accomplished on the top (11) and bottom (16) surfaces. The structure (10) is then drilled (21) at the locations that require the formation of through holes (passing through the entire structure (10)) which may also be referred to hereafter as through vias or just vias. After several plating and subtractive processes are performed, the PTH (22) are formed that permit connections with wiring plane (50) at the predefined locations as seen in FIG. 1B.

In the design of large computer systems, PCB with a significant number of signal layers are possible. Multiple vias may be required to form a connection of internal wiring (50) between mounted circuit devices (30) or connections (40) to other interfaces such as I/O connectors.

For power distribution, interconnections of internal reference planes are made by vias and the power supply or ground returns are then connected by vias to the surface mounted circuitry. In addition, other components such as de-coupling capacitors and passive devices can be connected by vias to the reference planes. These two types of vias never need to be modified but on occasion need to be reworked to repair any failing via location due to cracking or failure that may occur within the via structure.

When circuits are interconnected, or when translation between internal wiring (50) and the external surfaces are required, a length of stub metal (60) is formed by the PTH (22) as shown in FIGS. 1B and 2A. The added length of stub metal (60) from the internal wiring plane (50) to the unused via end (23), creates an added capacitance and inductance which can cause a discontinuity on the net. To eliminate this stub metal (60) on very high speed nets, a hole (70) is drilled to a depth (71) just below the internal wiring plane (50) as seen in FIG. 2B. This drilling procedure requires significant control, setup and tolerance for the drilling such that the via is not over drilled.

Another problem as shown in FIG. 3A, is the stress failure of a connection between an internal wiring plane (50) (or reference plane (12,15), not shown in FIG. 3A) and the via structure associated with PTH (22). Very small cracks (200) are known to form between the plating of the through hole wall (66) and the internal wiring plane (50). When this happens, the board is rendered useless at that location. The present day method to repair this type of failure is to perform an engineering change. Both ends of the connection are removed from the internal wiring and a new discrete wire is soldered between the components. Another method that is used is to drill out the failed via and to solder a repair plug into the hole to reconnect the internal net.

A third problem with a PTH (22) as seen in FIG. 3B, is that the thickness (67) of the PTH wall (66) varies at different points along the PTH (22). The varying thickness (67) creates a problem with reliability and also requires a larger size via or multiple vias be used to supply current to the active devices. At present there are no plating methods that insure uniform thickness throughout the PTH (22).

A fourth problem is the creation of very fine PTH in technologies that are on the same level of nano technologies.

Various solutions have been proposed to manufacture vias and interconnects in PCB.

Among these are Hayes U.S. Pat. No. 5,377,902, Gruber et al. U.S. Pat. No. 6,461,136, Gruber et al. U.S. Pat. No. 6,708,873, Bourrieres et al. U.S. Pat. No. 6,783,797, Larson U.S. Pat. No. 6,982,191 and Curcio et al. U.S. Patent Application Publication US 2001/0027842, the disclosures of which are incorporated by reference herein.

SUMMARY OF THE INVENTION

The advantages of the present invention have been achieved by providing, according to a first aspect of the invention a method of forming solid vias in a printed circuit board, the method comprising the steps of:

a. obtaining a printed circuit board having at least one internal wiring layer;
 b. forming at least one through hole in the printed circuit board;
 c. placing the printed circuit board on a template having at least one projection in alignment with the at least one through hole;
 d. injecting a predetermined amount of solder into the at least one through hole so as to contact an end of the at least one projection and at least partially fill the at least one through hole, the solder contacting at least one internal wiring layer; and e. removing the printed circuit board from the template.

According to a second aspect of the invention, there is provided a method of forming solid vias in a printed circuit board, the method comprising the steps of:

a. obtaining a printed circuit board having a plurality of internal wiring layers;

b. forming a plurality of through holes in the printed circuit board;

c. placing the printed circuit board on a template having a plurality of projections in alignment with the plurality of through holes;

d. injecting a predetermined amount of solder into the plurality of through holes so as to contact an end of the plurality of projections and at least partially fill the through holes, the solder contacting at least one internal wiring layer; and e. removing the printed circuit board from the template.

According to a third aspect of the invention, there is provided a printed circuit board comprising a plurality of layers, a plurality of internal wiring layers and a plurality of through holes wherein at least one through hole has a first portion that is completely filled with an electrically conductive material to form a solid through hole portion and a second portion that is completely filled with an electrically insulative material wherein the first portion electrically connects a plurality of internal wiring layers.

According to a fourth aspect of the invention, there is provided a method of forming solid vias in a printed circuit board, the method comprising the steps of:

a. obtaining a printed circuit board having at least one internal wiring layer;

b. forming at least one through hole in the printed circuit board;

c. placing a cap in the at least one through hole; and d. injecting a predetermined amount of conductive epoxy into the at least one through hole so as to contact the cap and at least partially fill the at least one through hole, the conductive epoxy contacting at least one internal wiring layer.

According to a fifth aspect of the invention, there is provided a method of forming solid vias in a printed circuit board, the method comprising the steps of:

a. obtaining a printed circuit board having at least one internal wiring layer;

b. forming a plurality of through holes in the printed circuit board;

c. placing an electrically insulating cap in a first through hole;

d. placing a first electrically conducting cap in a second through hole; and e. injecting a predetermined amount of conductive epoxy into the first and second through holes so as to contact the electrically insulating cap and the electrically conducting cap and at least partially fill the first and second through holes, the conductive epoxy contacting at least one internal wiring layer in the first through hole; and f. placing a second electrically conducting cap at an opposite end of the second through hole.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
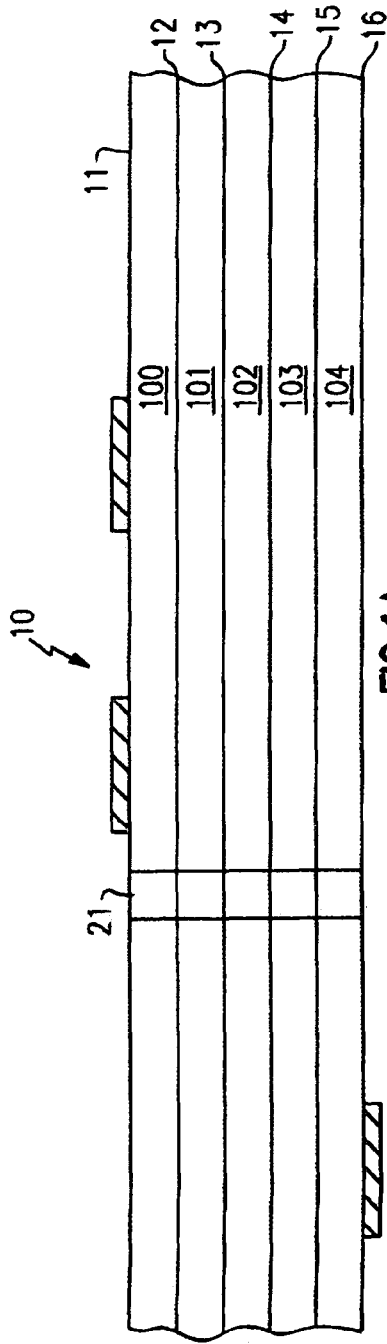
FIG. 1A shows multiple PCB cores laminated together with a drilled through hole.

The shortcomings of the prior art are overcome and additional advantages are provided through the creation of electrical connections that eliminate or reduce the need for PTH in the PCB.

U.S. Pat. No. 5,377,902, supra, describes a method that permits the injection of well defined, programmed volume solder balls on the I/O (input/output) interface of an integrated circuit thus forming an interface between the chip circuitry and the next level of packaging. If a similar approach of forming liquid solder balls were used but for an entirely different application of constructing PCB through holes according to an embodiment of the present invention, a structure could be formed that would permit an interconnection between components that eliminates stub parasitics and at the same time, provides additional features such as elimination of via failures due to stress cracking. The liquid solder could be injected into pre-drilled holes on a PCB, and the depth of the solder column could be controlled by a restraining plug or in the case of a top to bottom via structure, a restraining cup structure at the bottom surface of the PCB. After all of the injected solder columns are formed, the PCB is subjected to a thermal re-flow, thereby forming a solid interconnection between the internal wire and the external surface.

By adjusting the amount of injected solder, it is possible to form interconnects between internal signals or power layers without using the full depth of the drilled hole.

After a reflow cycle, the new via will remain attached to the wiring layers within the through hole location. By the use of this new via structure, a different approach to the blind via concept is provided in the fabrication of PCB. That is to say, a signal net can be connected to another net on a different layer well within the core structure of the PCB, all without the unwanted stubs presently produced with today's methods.

Another new use for the liquid solder formed via is the ability to repair a PCB due to the cracking phenomenon of the connection between the internal wiring plane and the via. In present PCB design technology, sometimes a failure occurs between the internal wiring plane or reference place and the PTH due to stress cracking. If as in the PTH structure, such a failure occurs between the solder column and the internal wiring plane, a simple solder reflow of the PCB according to an embodiment of the present invention would reconnect the via to the internal wiring plane.

With the formation of the liquid solder column via according to an embodiment of the present invention, the full diameter of the hole is used for the distribution of current to the active devices. Thus the current capability for a given via size is increased significantly. The present inventors have calculated that the resistance is reduced by 24% when a solid core via is used in place of a PTH thus providing a current increase capability of 24%. Therefore, a smaller via may be used or a lower number of vias can be used to supply the same amount of current. This would help in the design of power distribution schemes in a limited component wiring area.

To reduce the possibility of corrosion or contamination of the newly formed vias in the completed PCB, a polymer could be applied into or atop of all the via structures. This would be very helpful in retaining the solder column used for "blind via structures" from damage or failure during subsequent reflows or repairs and at the same time provide a protective barrier for all the other via locations. This application could also be used to form micro-via structures that are on the nanometer level.

In the design of organic packages, the use of a very controlled liquid solder injection method would have a great advantage as it would permit the formation of interconnections without the problems of plating small features.

According to another embodiment of the present invention, a conductive epoxy can be used in place of the liquid solder to attain similar advantages as described above.

Figure 4:
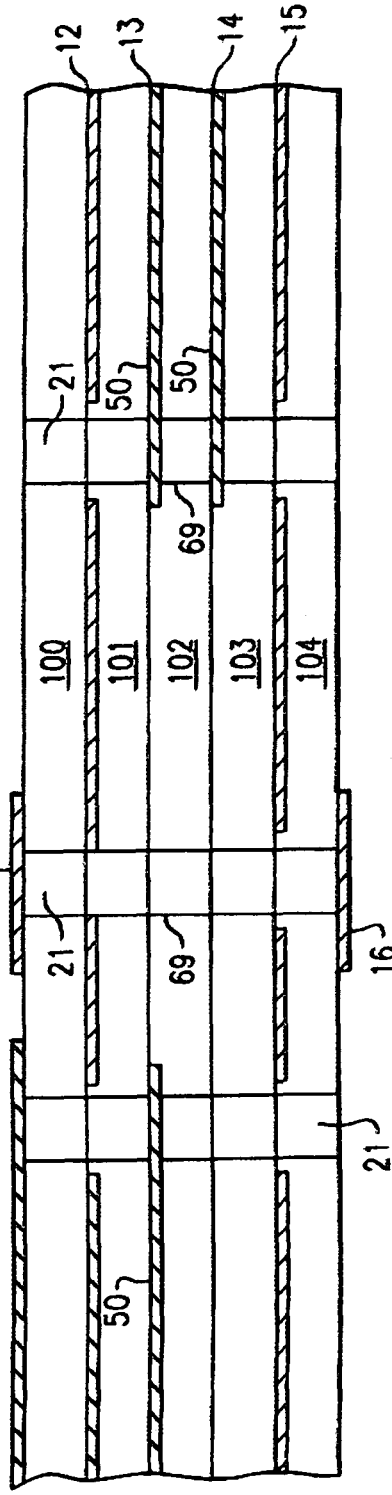
FIG. 4 shows a completed multilayer PCB structure with drilled through holes.

Referring to the Figures in more detail, and particularly referring to FIG. 4, there is illustrated the fabrication of a multilayer PCB with all internal layers processed in the present method up to final lamination but no further. The PBC is then drilled (21) at the desired locations and the formed holes are then brushed and burnished with a harden burnishing tool to clean out the holes and to expose the inner copper metal of the signal layers (13,14) and of the reference planes (12,15). Also, this process will create a smooth surface for both the side walls (69) of the through hole (21) and the exposed internal wiring plane (50). This process will help to facilitate a connection between the injected solder and the internal interconnection (50) and to reduce the chances of any voids or cracks between the via and the internal wiring plane (50). Next the through holes are cleaned and a flux material is injected into the through holes to facilitate the soldering process. The PCB is then processed according to an embodiment of the present invention.

Figure 5A:
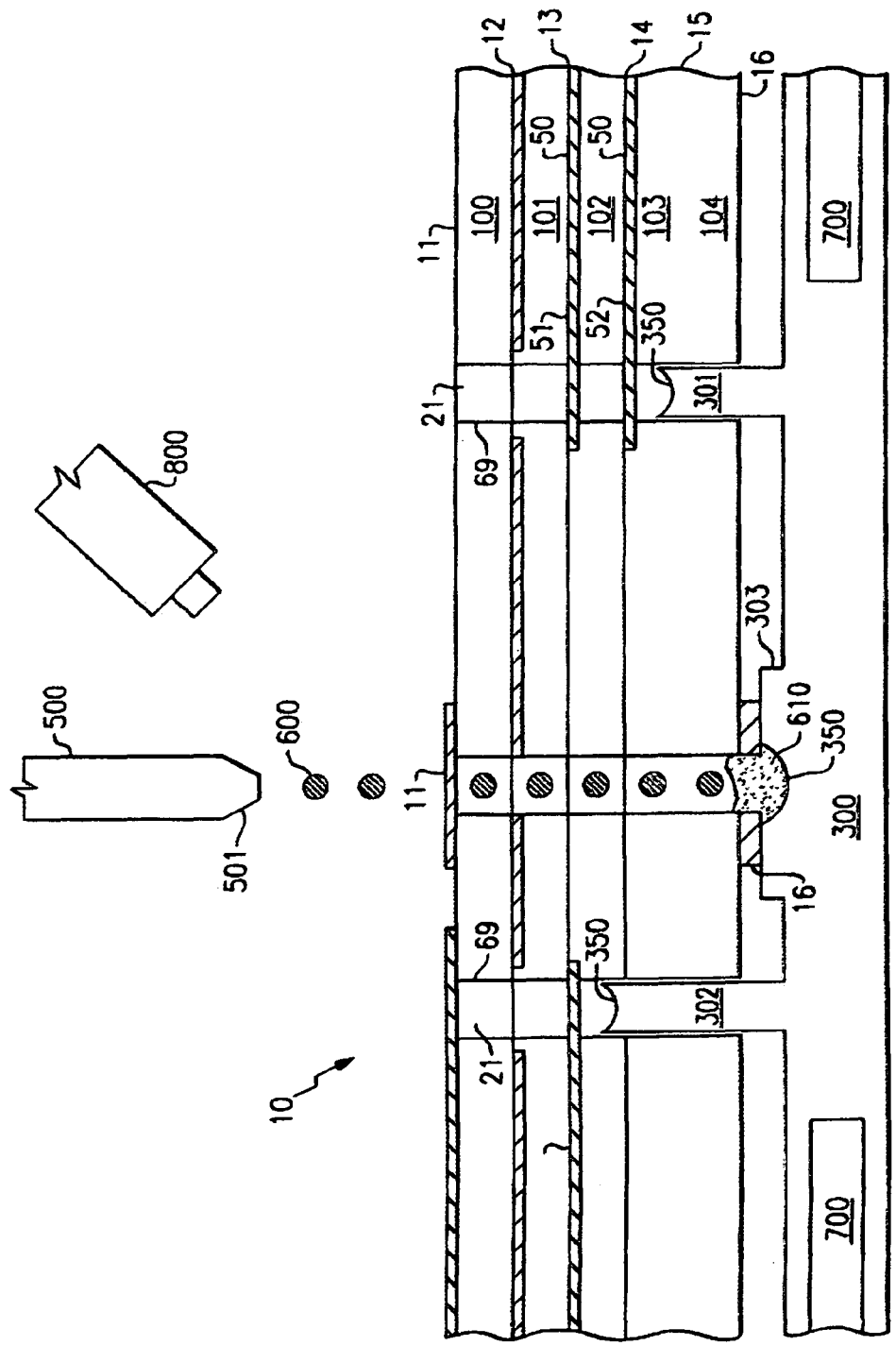
FIG. 5A shows a PCB on a template prepared for solder injection.
Figure 5B:
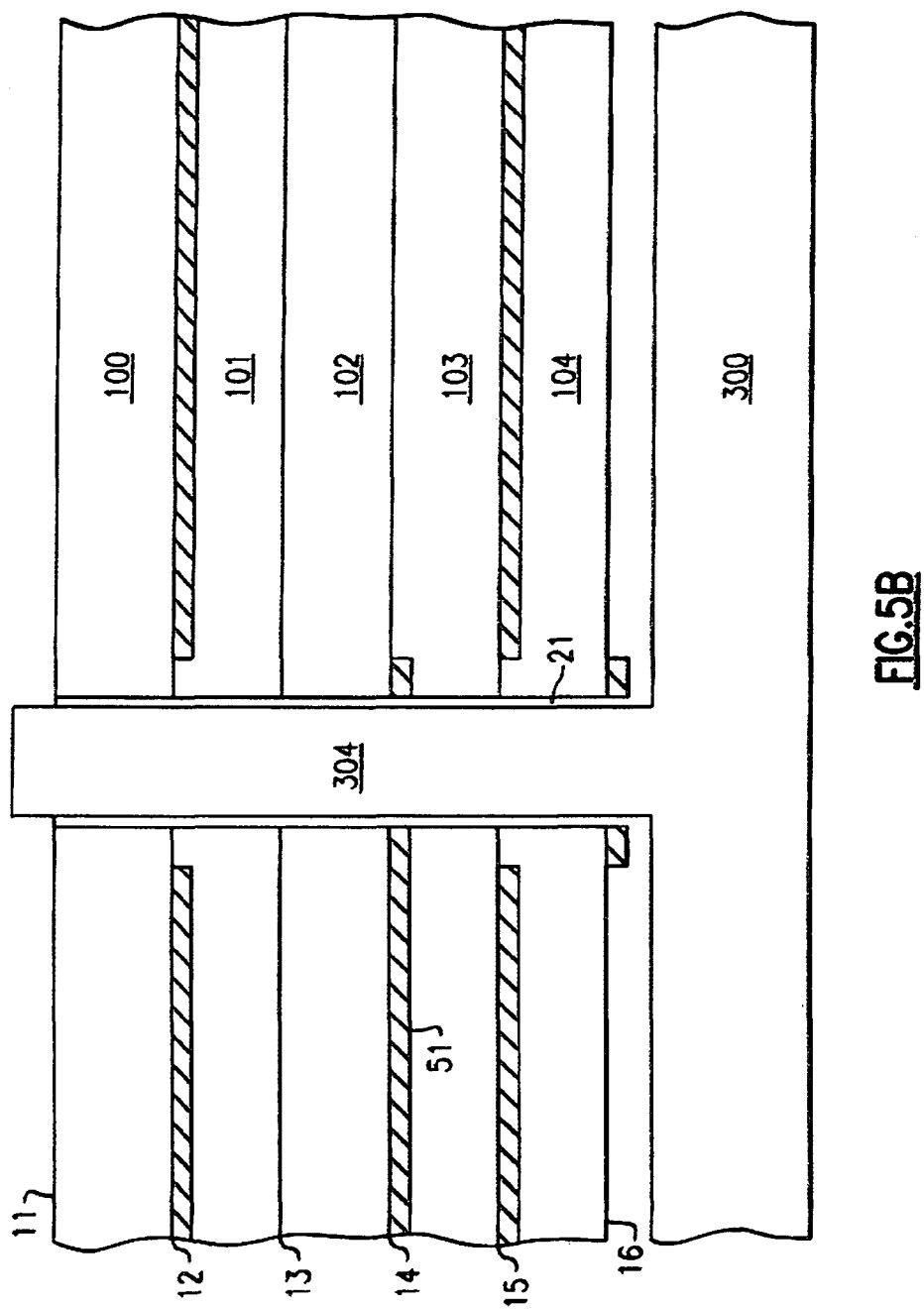
FIG. 5B shows a blocking projection of a template.

Referring now to FIG. 5A, there is shown a template (300), preferably continuously heated, consisting of an array of anodized aluminum projections (301,302,303), one for each of the drilled through holes (21), as part of an underlying support fixture (not shown). Each of the projections (301, 302, 303) would be of a predetermined height so that solder once injected into the though hole (21) would fill the though hole (21) from the desired internal location at the tip (350) of the projections (301, 302, 303) to the top surface (11). In the application where the solder connection is required to be from the bottom (16) of the board to the top (11) to entirely fill the through hole (21), the smallest projection (303) is used. For the locations that would connect to the bottom (16) of the PCB from internal wiring layers but not connect to the top side (11), the projection (304) would extend completely through and above the PCB so that no solder would enter the through hole (21), such as by spillage of solder or particle contamination, or fill that particular through hole (21) as shown in FIG. 5B. The PCB, in a subsequent step, would then be rotated over to the other side and placed on to a different template so that the via location that was not filled from the top side (11) due to the presence of projection (304) from the first template 300 could be filled from the bottom side (16). The process of filling through hole (21) with liquid solder would then be repeated as needed.

To better understand the invention, again refer to FIG. 5A. In conjunction with the liquid solder injector (500), a template (300) is used to support the PCB structure (10) and this template (300) is used to restrict the placement of the liquid solder by unique restriction projections (301,302,303) at each different via location. As can be seen, the projections (301, 302, 303) are formed to different configurations, depending on their use. A small projection (303) is use in applications that require a full column of solder from the top (11) of the PCB to the bottom (16). Other projections (302,301) are made to the specific length needed for the connection between the top (11) and the internal wiring plane (50) or from portion (51) of internal wiring plane (50) to another portion (52) of internal wiring plane (50). As the liquid solder is injected by means of a nozzle (501) the balls of solder (600) build up within the drilled through hole (21) and are melted into a pool of liquid solder (610) that is constrained by the projection (303). This pool of solder (610) can remain in a liquid state by means of the template (300) which is preferably heated to the eutectic melting point (if the solder is a eutectic solder) or the liquidus (if the solder is a noneutectic solder) of the solder by heater elements (700).

Figure 6:
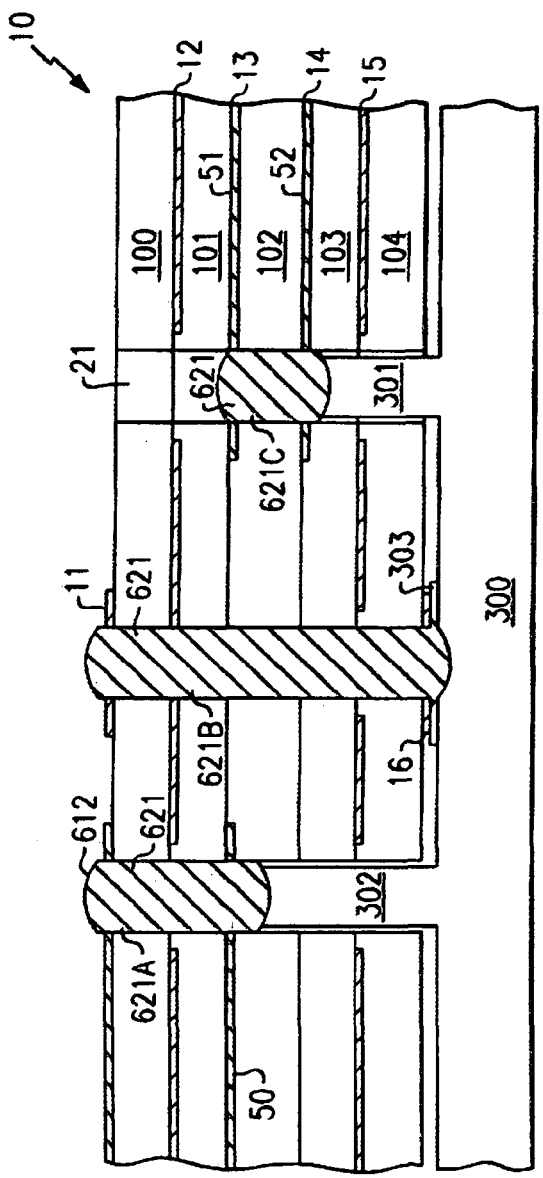
FIG. 6 shows a PCB on a template having various sized projections in the through holes of the PCB used to form the solder connections.

The solder injector fixture (500) could be programmed to dispense a specific volume of solder, and when required, the solder would slightly overfill the drilled through hole (21) in the applications when solder needs to reach the top surface (11) such as with solder columns 621A and 621B (FIG. 6). This will insure that after reflow, the surface tension of the solder would form a small dish (612) above the surface of the PCB as viewed in FIG. 6. In the application where the solder is used to connect only between two or more internal wiring plane portions (51,52) but not to the top (11) or bottom (16) of the PCB (10), such as with solder column 621C, the volume of solder is electronically restricted so that the drilled through hole (21) is not completely filled, but partially filled only with the amount of solder needed. This is the advantage of the programmable liquid injected method. The amount of solder for each location can be preprogrammed, and after the inspection of a send-ahead test fixture, the individual solder volume for each location may be adjusted. In addition, an optical sensor (800), as shown in FIG. 5A, could be used in conjunction with the injector (500), so that "on the fly" modifications to the solder volume are possible. This would compensate for the thickness variations of the PCB that are being processed. For this template approach, when the via columns are of different sizes, each restriction projection (301, 302, 303) is pre-formed to the diameter required such that this approach compensates for different via sizes.

Once the first refow is completed, the second and final set of interconnections are made on the other side of the PCB. The PCB is rotated over and the final set of interconnections are made on the other side of the PCB by a similar procedure just described and once completed the solder again is reflowed. During this process the solder from the first procedure is held in place by using the projections on a second template. The projections on the second template are used to contain the previously formed solder columns from melting and vacating the board. For the case of internal plane to plane connections, a pin plug is used to contain the internal solder mass.

For low speed and non-critical nets, the via location could be completely filled as defined in a top to bottom connection such as those used for power and ground locations since the presence of a via stub would not be that important to the performance of low speed and non-critical nets. The projections (301, 302, 303) used for the restraint of the amount of solder preferably would have a slight concave shape to them which would help to insure that the solder will form a ridged interface to the internal wiring layers. In addition, all the projections (301, 302, 303) in the template preferably would be heated to a temperature that would cause the solder to be at or near a eutectic state. This will help to eliminate all air pockets and flux residue from the solder columns.

Figure 1B:
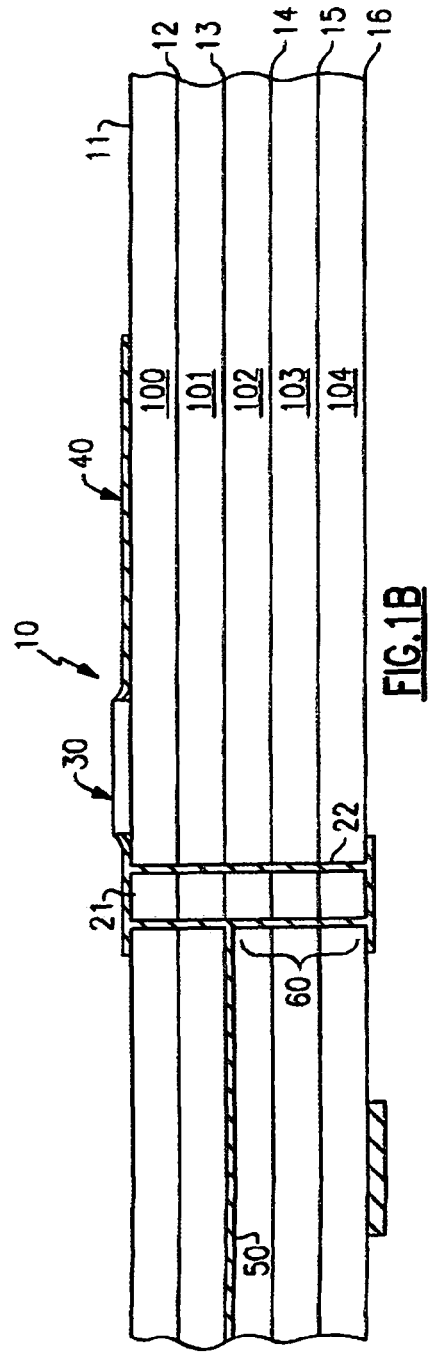
FIG. 1B shows multiple PCB cores laminated together with a PTH.
Figure 2A:
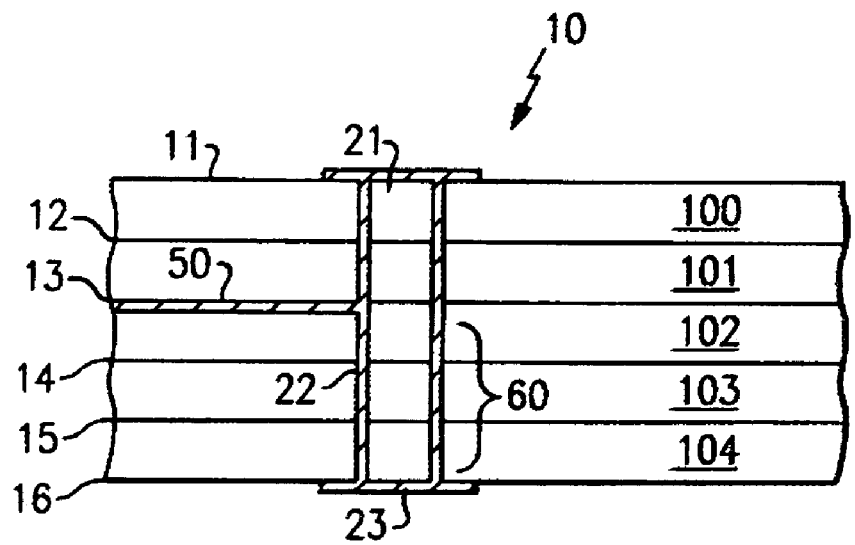
FIG. 2A shows a length of stub metal formed by the completed PTH.
Figure 2B:
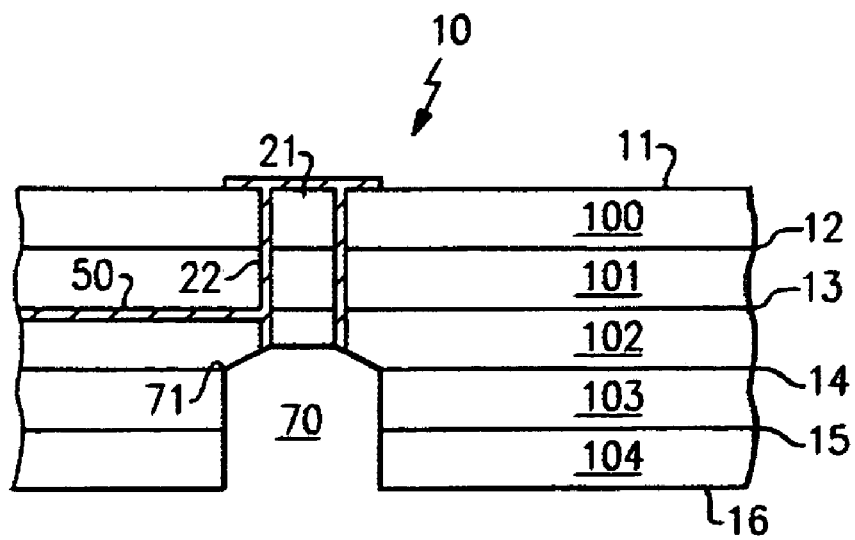
FIG. 2B shows a length of stub metal removed by a drilling procedure.
Figure 3B:
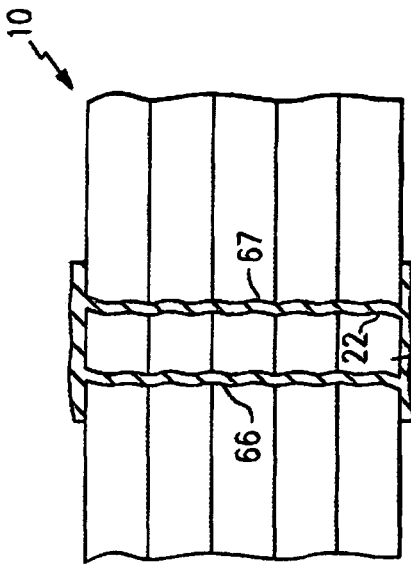
FIG. 3B shows variation in PTH wall thickness.
Figure 3A:
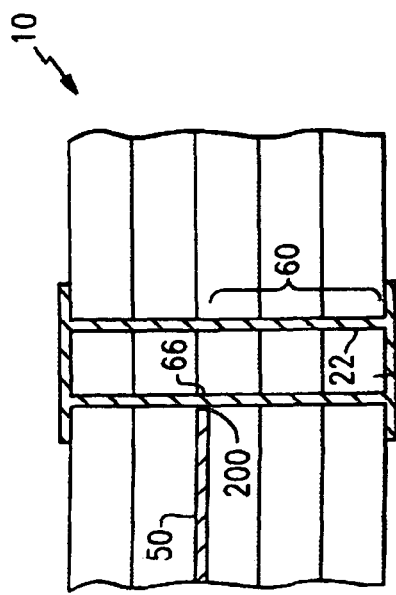
FIG. 3A shows a crack between a PTH and an internal wiring plane.
Figure 7A:
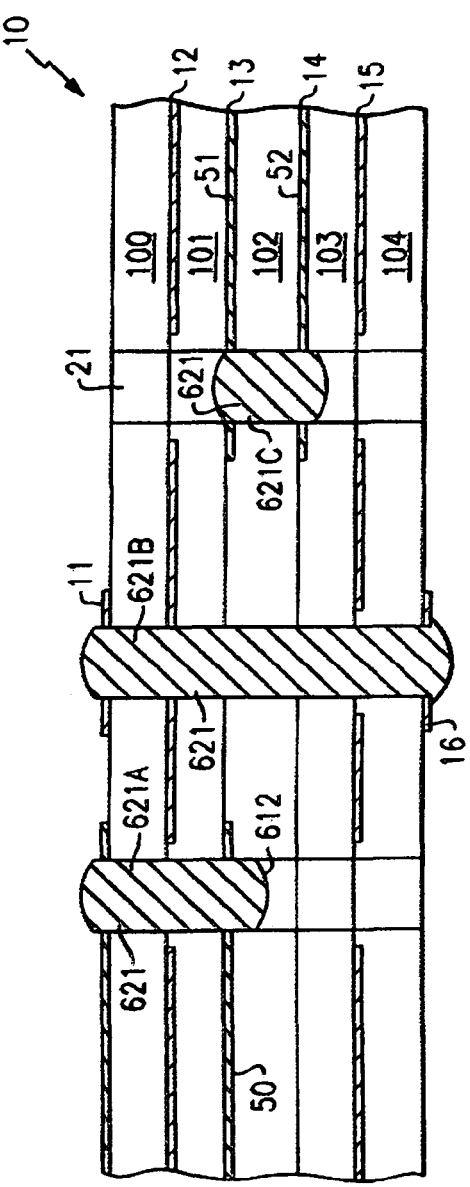
FIG. 7A shows a completed PCB structure.

The completed PCB structure (10) is shown in FIG. 7. It is clear that a connection within the PCB can be made and an elimination of the PTH is possible along with the via stub (via stub (60) shown in FIGS. 1B and 2A). The PCB structure (10) is cooled and the template is removed. The solder columns (621) all have a slight radius (612) on them due to the shape of the template projections (301, 302, 303). This radius (612) permits and insures that a good electrical connection is made between the solder column (621) and the internal wiring plane of interest (50, 51, 52).

Figure 7B:
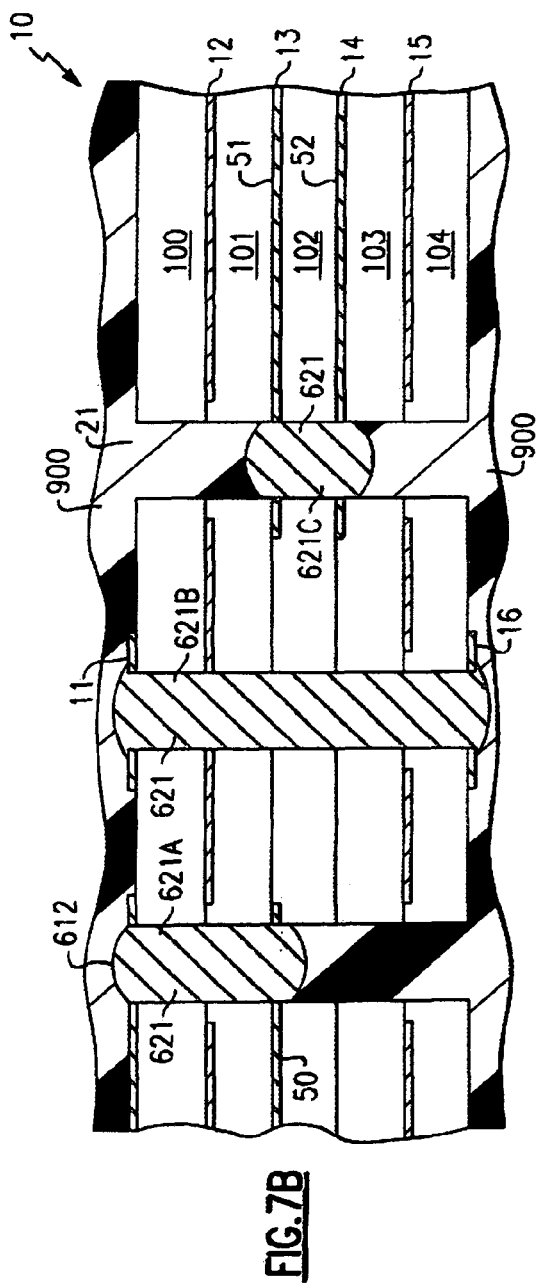
FIG. 7B the completed PCB structure of FIG. 7A with a sealing polymer overcoat.

Once the solder columns for the board are completed, an insulating polymer (900) shown in FIG. 7B is used to contain the solder columns (621) so that additional solder procedures can be made. This polymer (900) is applied to both sides of the PBC structure (10). This polymer (900) will fill all the drilled through holes (21) not otherwise occupied by the solder columns (621) and will at the same time seal the top (11) and bottom (16) surface metal. The use of this insulating polymer (900) is desired so that the solder columns (621) are not disturbed when the top and bottom components are soldered in place. In addition the polymer (900) will also form a barrier for the solder columns (621) so that future reflows can be made without the use of a template (300). In the event that a failure due to cracking at a metallic interface occurs, the reflow process can be performed again to reconnect the metallic interface. Thus a significant improvement on the electrical characteristics of the PCB is possible both for signal integrity but also for power distribution and reliability.

Polymers suitable for use as insulating polymer (900) include, but are not limited to, polyimide and solder resists (also known as solder masks) such as epoxy and UV solder resists.

Figure 8:
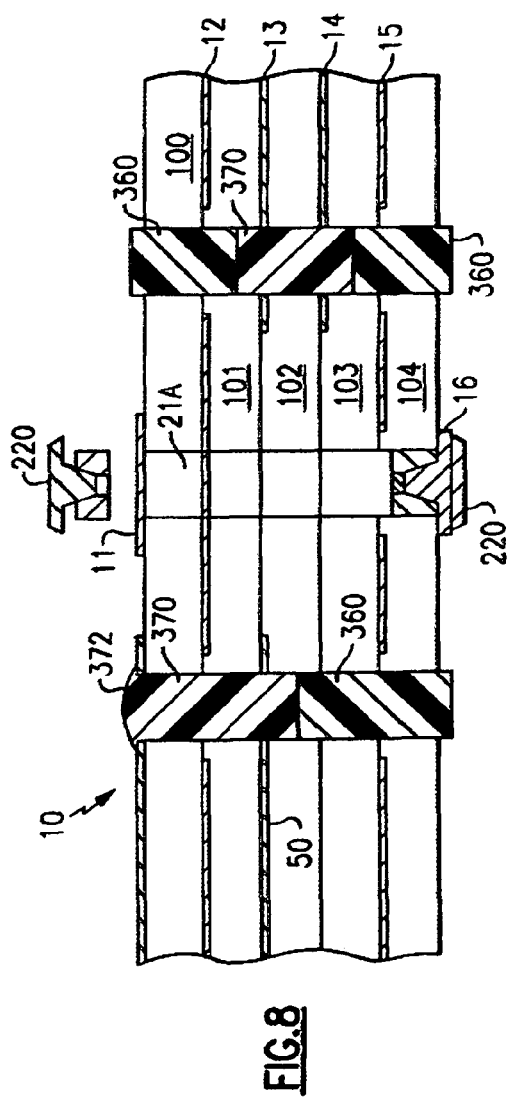
FIG. 8 shows another embodiment of a PCB structure with conductive epoxies.

An alternate method for the creation of a structure without PTH could be obtained in the following manner. The creation of the PCB is the same as described previously. Referring to FIG. 8, instead of using a liquid solder, one could fill the drilled holes (21) with a conductive epoxy (370). To retain the epoxy (370), a plug (360) of an insulator material such as FR4 could be swaged into the through hole (21). The epoxy (370) would be permitted to overflow the through hole (21) to form a connection (372) to the top surface metal (11). For the instances that require a top (11) to bottom (16) connection, an electrically conductive cap (220), preferably copper or brass, would be swaged into the through hole (21) followed by filling with conductive epoxy (370) and then another electrically conductive cap (220), also preferably copper or brass. Through hole (21A) shows one electrically conductive cap (220) in place prior to filling the through hole (21A) with conductive epoxy. After filling through hole (21A), the second electrically conductive cap (220) would be swaged into through hole (21A). The electrically conductive caps (220) would form a contact with the top metal (11) and the bottom metal (16). When the components (chips, capacitors, etc.) are soldered to the PCB (10), the solder will also mechanically and electrically attach the caps (220) to the PCB (10).

What is claimed is:

1. A method of forming solid vias in a printed circuit board, the method comprising the steps of:
    obtaining a printed circuit board having at least one internal wiring layer;
    forming at least one through hole in the printed circuit board;
    placing the printed circuit board on a template having at least one projection in alignment with the at least one through hole;
    injecting a predetermined amount of solder into the at least one through hole so as to contact an end of the at least one projection and at least partially fill the at least one through hole, the solder contacting at least one internal wiring layer; and
    removing the printed circuit board from the template.

2. The method of claim 1 wherein the printed circuit board has a first and second side and the step of removing is removing the first side of the printed circuit board from the template, wherein the template is a first template, and further comprising the steps of:
    turning over the printed circuit board so that the second side of the printed circuit board is placed on a second template having at least one projection;
    injecting a predetermined amount of solder into at least one through hole so as to contact an end of the at least one projection of the second template and at least partially fill the at least one through hole, the solder contacting at least one internal wiring layer; and
    removing the second side of the printed circuit board from the second template.

3. The method of claim 1 wherein the at least one through hole has a sidewall and the sidewall is devoid of metal except where the sidewall is in contact with the solder or an internal wiring layer.

4. The method of claim 1 wherein the template is heated.

5. The method of claim 1 further comprising the step of overcoating the at least one via and printed circuit board with an insulating material.

6. A method of forming solid vias in a printed circuit board, the method comprising the steps of:
    obtaining a printed circuit board having a plurality of internal wiring layers;
    forming a plurality of through holes in the printed circuit board;
    placing the printed circuit board on a template having a plurality of projections in alignment with the plurality of through holes;
    injecting a predetermined amount of solder into the plurality of through holes so as to contact an end of the plurality of projections and at least partially fill the through holes, the solder contacting at least one internal wiring layer; and
    removing the printed circuit board from the template.

7. The method of claim 6 wherein the plurality of through holes have a sidewall and the sidewall is devoid of metal except where the sidewall is in contact with the solder or an internal wiring layer.

8. The method of claim 6 wherein at least one through hole is only partially filled with solder.

9. The method of claim 6 wherein at least two projections are of a different length.

10. The method of claim 6 wherein the template is heated.

11. The method of claim 6 further comprising the step of overcoating the plurality of through holes and printed circuit board with an insulating material.

12. The method of claim 11 wherein the insulating material is selected from the group consisting of polyimide and solder resist.

13. The method of claim 11 further comprising the step of reflowing the solder-filled through hole.

14. The method of claim 6 wherein the projection has a cupped end.

15. The method of claim 6 wherein the printed circuit board has a first and second side and the step of removing is removing the first side of the printed circuit board from the template, wherein the template is a first template, and further comprising the steps of:

turning over the printed circuit board so that the second side of the printed circuit board is placed on a second template having at least one projection;

injecting a predetermined amount of solder into at least one through hole so as to contact an end of the at least one projection of the second template and at least partially fill the at least one through hole, the solder contacting at least one internal wiring layer; and removing the second side of the printed circuit board from the second template.

* * * * *